(12) United States Patent
Chung

(10) Patent No.: US 10,483,285 B2
(45) Date of Patent: Nov. 19, 2019

(54) ELEMENT SUBSTRATE AND DISPLAY DEVICE

(71) Applicant: Innolux Corporation, Miao-Li County (TW)

(72) Inventor: Wang-Cheng Chung, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 15/604,663

(22) Filed: May 25, 2017

(65) Prior Publication Data
US 2017/0352689 A1  Dec. 7, 2017

Related U.S. Application Data

(60) Provisional application No. 62/343,860, filed on Jun. 1, 2016.

(30) Foreign Application Priority Data

Oct. 31, 2016  (CN) .......................... 2016 1 0928200

(51) Int. Cl.
  *H01L 27/12*   (2006.01)
  *H01L 29/786*  (2006.01)
  (Continued)

(52) U.S. Cl.
  CPC ........ *H01L 27/1225* (2013.01); *G02F 1/1368* (2013.01); *H01L 29/41733* (2013.01);
  (Continued)

(58) Field of Classification Search
  CPC ........... H01L 29/41733; H01L 29/7869; H01L 29/78696; H01L 27/3262; G02F 1/1368; G02F 2202/10
  See application file for complete search history.

(56) References Cited

U.S. PATENT DOCUMENTS 6,255,706 B1 * 7/2001 Watanabe ............. H01L 29/458
                                                      257/350
6,861,368 B2    3/2005 Chae
                  (Continued)

FOREIGN PATENT DOCUMENTS

CN    102598278    7/2012
CN    102648526    8/2012

OTHER PUBLICATIONS

"Office Action of China Counterpart Application," dated Jun. 4, 2019, p. 1-p. 7.

*Primary Examiner* — Nathanael R Briggs
(74) *Attorney, Agent, or Firm* — JCIPRNET

(57) ABSTRACT

An element substrate and a display device are provided. The element substrate includes a substrate and an element layer, and the element layer is disposed on the substrate, wherein the element layer includes a plurality of active elements, each of the active elements includes a gate, a gate insulating layer, a metal oxide semiconductor layer, a source and a drain. The gate is disposed on the substrate. The gate insulating layer is disposed on the substrate and overlaps the gate. The metal oxide semiconductor layer is disposed on the gate insulating layer. The source and the drain are disposed on the metal oxide semiconductor layer, wherein the source and the drain respectively include a first layer and a second layer, the first layer is between the second layer and the metal oxide semiconductor layer, and the material of the first layer includes titanium nitride. Thereby, during the process of manufacturing the active elements, titanium atoms are not easy to diffuse into the metal oxide semiconductor layer so that the element substrate and the display device have good reliability.

6 Claims, 4 Drawing Sheets

(51) Int. Cl.
 *H01L 29/417* (2006.01)
 *G02F 1/1368* (2006.01)
 *H01L 27/32* (2006.01)
(52) U.S. Cl.
 CPC .... *H01L 29/7869* (2013.01); *H01L 29/78696*
 (2013.01); *H01L 27/3262* (2013.01)

(56) References Cited

U.S. PATENT DOCUMENTS

| | | |
|---|---|---|
| 7,811,868 B2 | 10/2010 | Kim et al. |
| 7,851,920 B2 | 12/2010 | Lee et al. |
| 2011/0084268 A1* | 4/2011 | Yamazaki ........... H01L 27/1214 257/43 |
| 2014/0159037 A1* | 6/2014 | Kwon ............... H01L 29/78618 257/43 |
| 2018/0046004 A1* | 2/2018 | Yamazaki ............. G02F 1/1343 |

* cited by examiner

ELEMENT SUBSTRATE AND DISPLAY DEVICE

CROSS-REFERENCE TO RELATED APPLICATION

This application claims the priority benefits of U.S. provisional application Ser. No. 62/343,860, filed on Jun. 1, 2016 and China application serial no. 201610928200.2, filed on Oct. 31, 2016. The entirety of each of the above-mentioned patent applications is hereby incorporated by reference herein and made a part of this specification.

BACKGROUND OF THE INVENTION

Field of the Invention

The disclosure relates to an element substrate and a display device.

Description of Related Art

The thin film transistors have been widely applied in various high-order display devices. The fast competition of the market, the requirements of the size and the display color saturation level of the display device are rapidly increased with the requirements of the electrical performance and stability of the thin film transistor. The metal oxide semiconductor (MOS) thin film transistors can be manufactured at room temperature and have good electric characteristics, lower leakage current and the electron mobility that is higher than that of the amorphous silicon thin film transistors (a-Si TFT) more than ten times. As a result, the metal oxide semiconductor thin film transistor can reduce the power consumption of the display device and improve the operating frequency of the display device, and become a mainstream driving element for the next generation to replace a conventional amorphous silicon thin film transistor.

SUMMARY OF THE INVENTION

The disclosure is related to an element substrate and a display device with good reliability.

According to an embodiment of the disclosure, an element substrate including a substrate and an element layer is provided. The element layer is disposed on the substrate, the element layer includes a plurality of active elements, and the active elements includes a gate, a gate insulating layer, a metal oxide semiconductor layer, a source and a drain. The gate is disposed on the substrate. The gate insulating layer is disposed on the substrate and overlaps the gate. The metal oxide semiconductor layer is disposed on the gate insulating layer. The source and the drain are disposed on the metal oxide semiconductor layer, the source and the drain respectively include a first layer and a second layer, the first layer is disposed between the second layer and the metal oxide semiconductor layer, and the material of the first layer includes titanium nitride.

According to an embodiment of the disclosure, a display device including an element substrate, an opposing substrate, and a display layer is provided. The element substrate includes a substrate and an element layer. The element layer is disposed on the substrate, the element layer includes a plurality of active elements, and the active elements includes a gate, a gate insulating layer, a metal oxide semiconductor layer, a source and a drain. The gate is disposed on the substrate. The gate insulating layer is disposed on the substrate and overlaps the gate. The metal oxide semiconductor layer is disposed on the gate insulating layer. The source and the drain are disposed on the metal oxide semiconductor layer, the source and the drain respectively include a first layer and a second layer, the first layer is disposed between the second layer and the metal oxide semiconductor layer, and the material of the first layer includes titanium nitride. The opposing substrate is disposed opposite to the element substrate. The display layer is disposed between the element substrate and the opposing substrate.

Based on the above, in the element substrate and the display device of the present disclosure, the active element includes the gate, the gate insulating layer, the metal oxide semiconductor layer, the source and the drain, wherein the source and the drain respectively include the first layer and the second layer stacked sequentially from the metal oxide semiconductor layer, and the material of the first layer includes titanium nitride. Accordingly, titanium atoms do not easily diffuse into the metal oxide semiconductor layer during the manufacture of the active element and thus the element substrate and the display device have good reliability.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, use to explain the principles of the disclosure.

DESCRIPTION OF THE EMBODIMENTS

Figure 1:
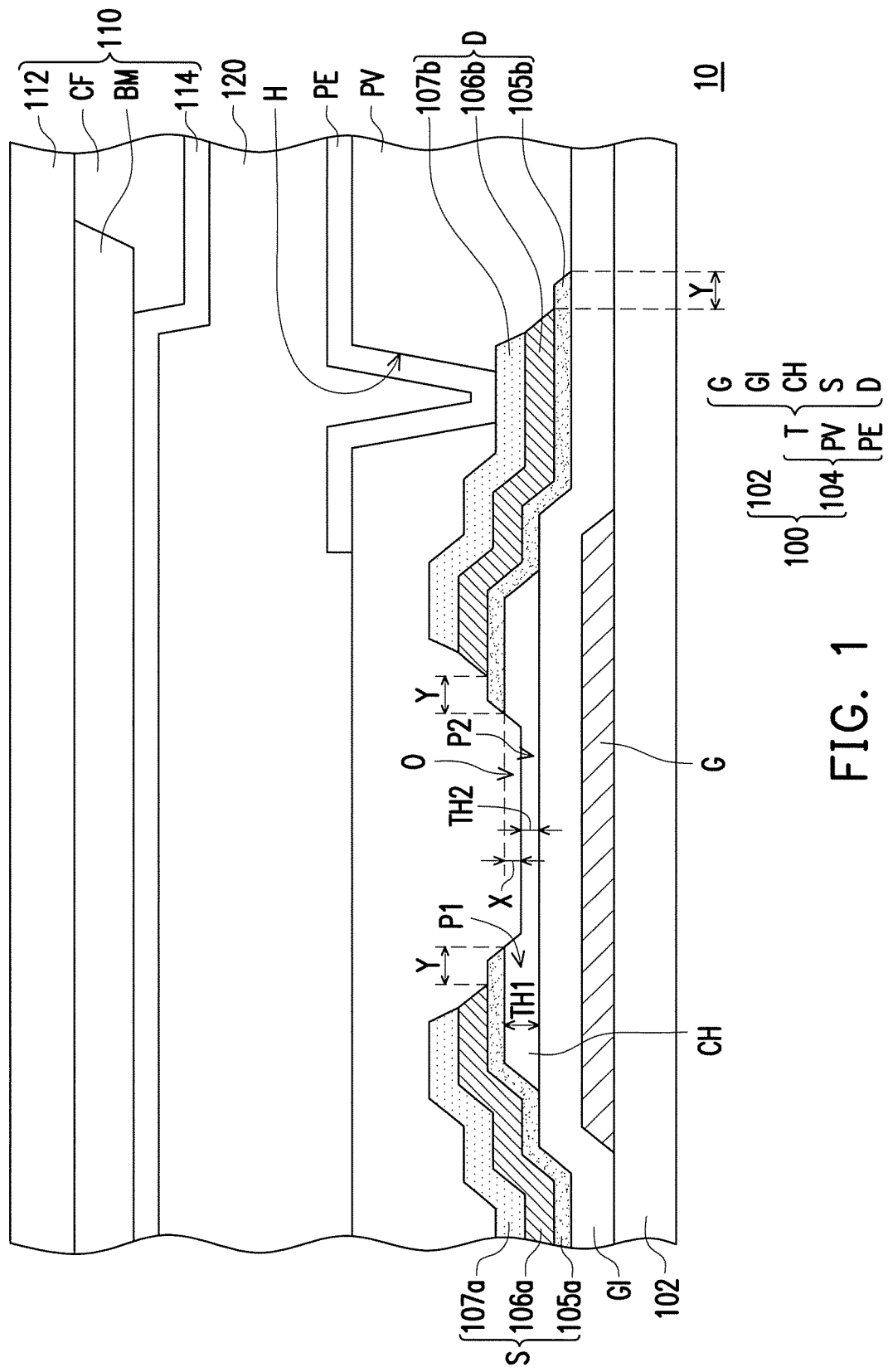
FIG. 1 is a partial cross-sectional view of a display device according to an embodiment of the present disclosure.

Reference will now be made in detail to the present preferred embodiments of the disclosure, examples of which are illustrated in the accompanying drawings. Wherever possible, the same reference numbers are used in the drawings and the description to refer to the same or like parts.

"A structure (or a layer, an element, a substrate) is located above another structure (or another layer, another element, another substrate)" may refer to "two structures are adjacent and directly contacted", "the lower surface of a structure is adjacent and directly contacted with the upper surface of another structure", or may refer to "two structures are adjacent but are not directly contacted", "at least one intermediate structure (or intermediate layer, intermediate element, intermediate substrate, medial spacing) is disposed between two structures", "the lower surface of a structure is adjacent or directly contacted with the upper surface of the intermediate structure", "the upper side surface of another structure is adjacent or directly contacted with the lower surface of the intermediate structure". And, the intermediate structure may be a single-layer or a multi-layer structure, but is not particularly limited.

Herein, the use of the term "electrically connected/coupled" may be referred to "directly connected" or "indirectly connected". When directly connected, the terminals of the elements on two circuits are directly connected or connected by a conductor line. When indirectly connected, a combination of one of the elements of a switch, a diode, a capacitor, an inductor and other non-conductor segment and at least one conductive segment or resistor, or a combination of at least two of said elements and at least one of said conductive segment or resistor is disposed between the terminals of the elements on two circuits.

Wherever possible, the same or similar element symbols are used in the drawings and the description to refer to the same or similar parts.

Figure 2:
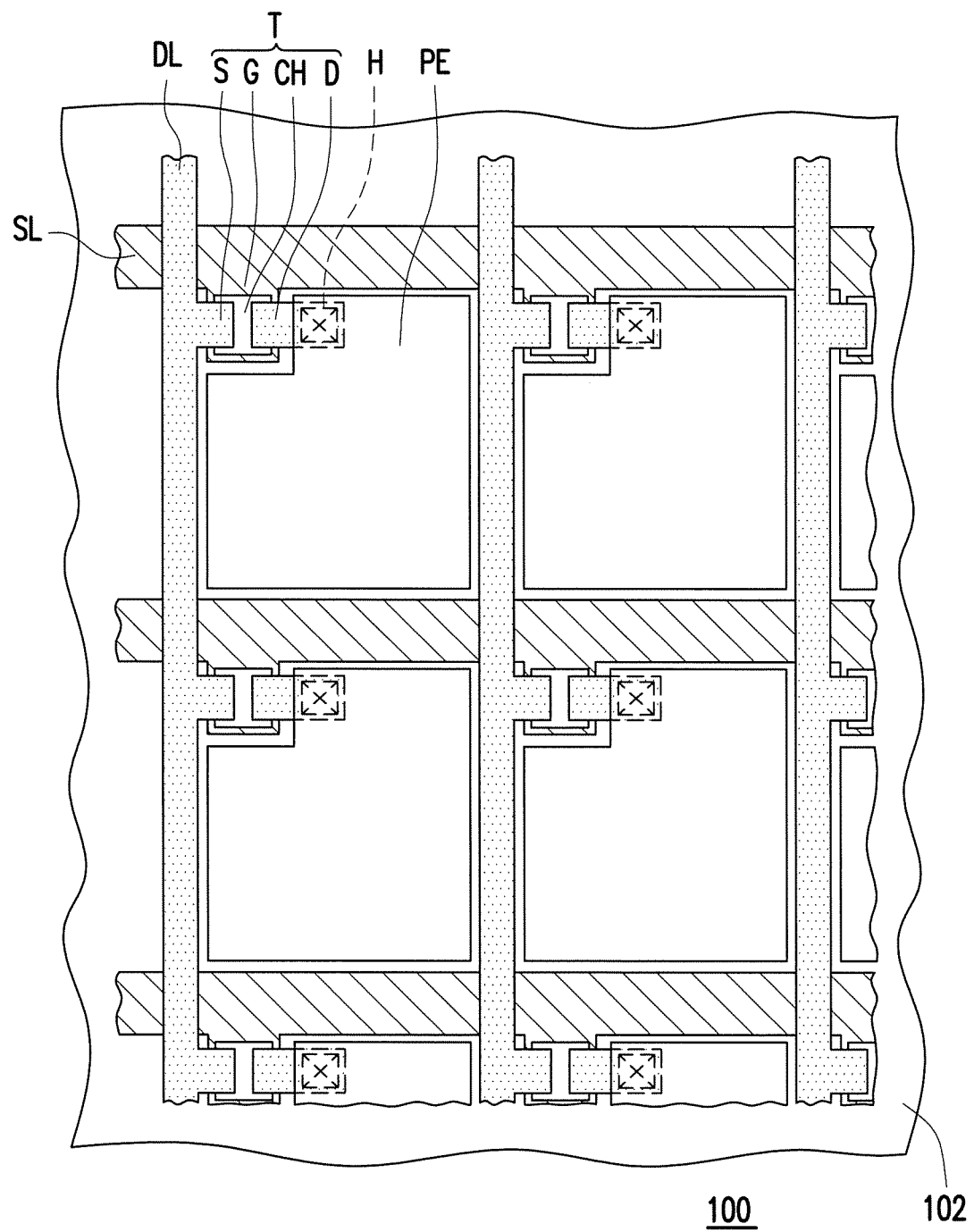
FIG. 2 is a partial top view of an element substrate according to an embodiment of the present disclosure.
Figure 3:
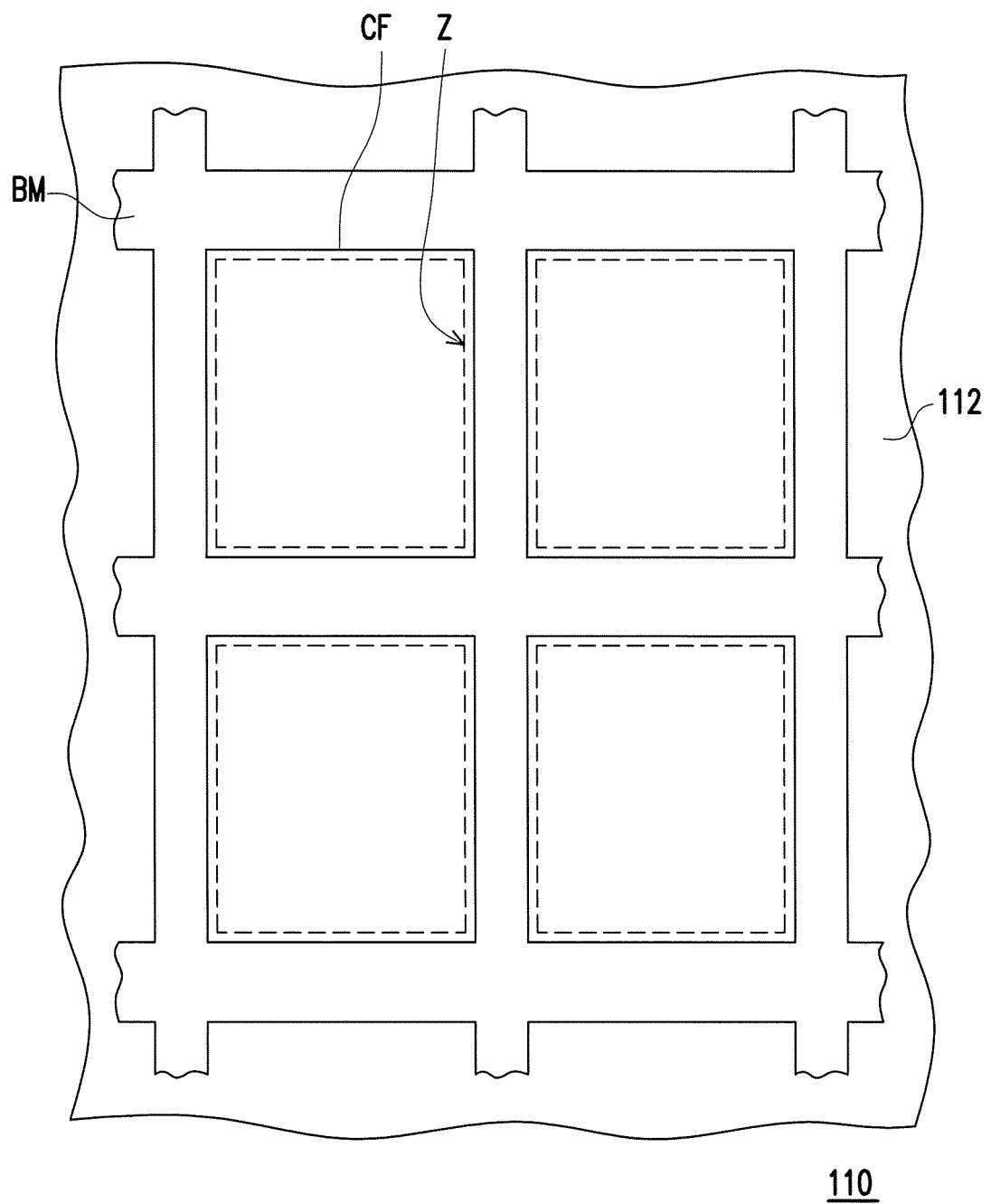
FIG. 3 is a partial top view of an opposing substrate according to an embodiment of the present disclosure.

FIG. 1 is a partial cross-sectional view of a display device according to an embodiment of the present disclosure. FIG. 2 is a partial top view of an element substrate according to an embodiment of the present disclosure. FIG. 3 is a partial top view of an opposing substrate according to an embodiment of the present disclosure. A part of film layers is omitted from FIG. 2 and FIG. 3 to clearly show the relationship between members.

Please referring to FIGS. 1, 2, and 3, a display device 10 includes an element substrate 100, an opposing substrate 110 and a display layer 120. In the present embodiment, the display device 10 is a liquid crystal display device, and the material of the display layer 120 includes a liquid crystal. In another embodiment, the display device 10 may be an inorganic diode light emitting display device, an organic light emitting diode display device (OLED device), an inorganic light emitting diode display device with micrometer size (micro LED device) or other non-liquid crystal type active or passive type display device, and the display device 10 may include or may not include the opposing substrate 110 and the various elements and film layers disposed on the opposing substrate 100, and the display layer 120 may be an organic light emitting diode unit, an inorganic light emitting diode unit or other types of display layers and display units (e.g., electro-wetting display media, electrophoretic display media, quantum dot display media, and the like), but the present disclosure are not limited thereto. In other embodiments, the display device 10 could be an organic light emitting diode display (OLED display) or an inorganic light emitting diode display with micrometer size (micro LED display). The display device 10 of the present embodiment is not limited to those shown in FIGS. 1, 2, and 3, and the person skilled in the art will understand that the display device 10 may have other parts (e.g., alignment films, polarizers, common electrode layers, common electrode lines, circuit storage capacitors and the like) according to the design requirements.

The element substrate 100 includes a substrate 102 and an element layer 104 disposed on the substrate 102. The material of the substrate 102 may be a single layer or a stack of one of glass, quartz, organic polymers, opaque/reflective materials (e.g., conductive materials, metals, wafers, ceramics, etc.) and other applicable materials, or a stack or a mixture of the at least two above-mentioned materials, but the present disclosure is not limited thereto. In the present embodiment, the element layer 104 is in direct contact with the substrate 102, and there is no intermediate layer therebetween. In another embodiment, there may be an intermediate layer, such as a buffer layer, between the element layer 104 and the substrate 102. The material of the buffer layer may be, but not limited to, a single layer or a stack of one of silicon oxide, silicon nitride, silicon oxynitride, aluminum oxide, a polyimide-based resin, an epoxy-based resin and an acrylic-based resin, or a stack or a mixture of the at least two above-mentioned materials. The buffer layer may provide functions of lattice-matching, water vapor impermeability, surface flattening, antireflection, and the like, but the present disclosure is not limited thereto.

The element layer 104 includes a plurality of active elements T. The element layer 104 further includes a plurality of scan lines SL, a plurality of data lines DL, an insulating layer PV, and a plurality of pixel electrodes PE. For convenience of explanation, only one active element T and one pixel electrode PE are shown in FIG. 1, but in practice the element layer 104 includes a plurality of active elements T arranged in an array and a plurality of pixel electrodes PE arranged in an array (as shown in FIG. 2).

The extending direction of the plurality of scan lines SL is different from the extending direction of the plurality of data lines DL. It is preferable that the extending direction of the plurality of scan lines SL is perpendicular to the extending direction of the plurality of data lines DL. In addition, the plurality of scan lines SL and the plurality of data lines DL are located in different film layers, and a gate insulating layer GI (described later in detail) or other single-layer or multi-layer insulating material is disposed between the plurality of scan lines SL and the plurality of data lines DL. In general, the plurality of scan lines SL and the plurality of data lines DL are made of a metal material based on the conductivity. However, the present disclosure is not limited thereto. In another embodiment, the plurality of scan lines SL and the plurality of data lines DL may be, for example but not limited to, a single layer or a stack of one of other conductive materials (e.g., alloys, nitride of metal materials, oxide of metal materials, oxynitride of metal materials, etc.), or a stack or a mixture of a metal material and the other conductive material described above.

The active elements T are arranged on the substrate 102 in an array. The active elements T is electrically connected to one of the scan lines SL and one of the data lines DL. In the present embodiment, the active elements T includes a gate G, a gate insulating layer GI, a metal oxide semiconductor layer CH, a source S, and a drain D. In the present embodiment, the active elements T are bottom gate type active elements. However, in another embodiment, the active elements T may be top gate type active elements or coplanar type active elements, but the present disclosure is not limited thereto.

In the present embodiment, the gate G and the corresponding scan line SL are continuous conductive pattern, and this means that the gate G is electrically connected to the corresponding scan line SL. From another point of view, in the present embodiment, the gates G and the scan lines SL belong to the same film layer, that is, the gates G and the scan lines SL are made of the same material and are formed by the same process. In additional, one of the source S and the drain D is electrically connected to the corresponding data line DL. In an embodiment, the method of forming the gates G and the scan lines SL includes, performing a photolithography etching process on a conductive material layer, for example. In another embodiment, the gates G and the scan lines SL may belong to two different film layers which formed by different processes, and may include the same material or different materials, but the present disclosure is not limited thereto.

In the present embodiment, the gate insulating layer GI is disposed on the substrate 102 and overlaps the gate G. In another embodiment, the gate insulating layer GI is disposed on the substrate 102 and overlaps a semiconductor layer, and the gate insulating layer GI is disposed between the gate G and the semiconductor layer. The material of the gate insulating layer GI includes, for example but not limited to, an inorganic material, an organic material, or a combination thereof. The inorganic material includes, but not limited to, silicon oxide, silicon nitride, silicon oxynitride, aluminum oxide. The organic material includes, for example but not limited to, a single layer or a stack of one of polymer materials such as a polyimide-based resin, an epoxy-based resin, an acrylic-based resin, or a stack or a mixture of at least two of the polymer materials. In an embodiment, the gate insulating layer GI may be deposited on the substrate 102 by a physical vapor deposition or a chemical vapor deposition, for example. Additionally, the gate insulating layer GI is not shown in FIG. 2.

In the present embodiment, the metal oxide semiconductor layer CH is disposed on the gate insulating layer GI, and corresponds to the gate G. In another embodiment, the metal oxide semiconductor layer CH is overlapped by the gate insulating layer GI, and the metal oxide semiconductor layer CH corresponds to the gate G. In the present embodiment, the material of the metal oxide semiconductor layer CH may include, but not limited to, a single layer or a stack of one of indium gallium zinc oxide (IGZO), aluminum zinc oxide (AZO), indium tin zinc oxide (ITZO) and zinc oxide (ZnO), or a stack or a mixture of the at least two above-mentioned materials. That is, in the present embodiment, the active elements T are metal oxide semiconductor thin film transistors.

In addition, in the present embodiment, the metal oxide semiconductor layer CH has a recessed portion O. In an embodiment, the method of forming the recessed portion O includes, for example, performing a dry etching process on the metal oxide semiconductor layer CH by using the source S and the drain D as a mask, wherein the dry etching gas used in the dry etching process includes, for example, one of chlorine gas ($Cl_2$), carbon tetrafluoride ($CF_4$), oxygen ($O_2$), boron trichloride ($BCl_3$) and sulfur hexafluoride ($SF_6$), or a mixture of the at least two above-mentioned materials. That is, in the present embodiment, the active elements T belong to bottom gate type back channel etch (BCE) active elements. In addition, the metal oxide semiconductor layer CH has a first portion P1 and a second portion P2 through the formation of the recessed portion O, wherein the source S and the drain D overlap the first portion P1 but the source S and the drain D do not overlap the second portion P2. The first thickness TH1 of the first portion P1 is greater than the second thickness TH2 of the second portion P2. In the present embodiment, the depth X (i.e., the difference between the first thickness TH1 and the second thickness TH2) of the recessed portion O is, for example, the depth X is greater than or equal to 200 Å and less than or equal to 600 Å (200 Å≤X≤600 Å). And, in another embodiment, the depth X of the recessed portion O is, for example, the depth X is greater than or equal to 300 Å and less than or equal to 500 Å (300 Å≤X≤500 Å).

The source S and the drain D are arranged on the metal oxide semiconductor layer CH. In the present embodiment, the source S and the drain D are laminated electrodes. In detail, in the present embodiment, the source S includes a first layer 105a, a second layer 106a, and a third layer 107a, and the drain D includes a first layer 105b, a second layer 106b, and a third layer 107b, wherein the first layer 105a, the second layer 106a, and the third layer 107a are sequentially stacked from the metal oxide semiconductor layer CH, and the first layer 105b, the second layer 106b, and the third layer 107b are sequentially stacked from the metal oxide semiconductor layer CH. In other words, the first layer 105a of the source S is disposed between the metal oxide semiconductor layer CH and the second layer 106a, the second layer 106a is disposed between the first layer 105a and the third layer 107a, the first layer 105b of the drain D is disposed between the metal oxide semiconductor layer CH and the second layer 106b, the second layer 106b is disposed between the first layer 105b and the third layer 107b. The first layer 105a, the second layer 106a, and the third layer 107a are indirectly contact, and the first layer 105b, the second layer 106b, and the third layer 107b are indirectly contact. In the present embodiment, the first layer 105a and the first layer 105b are indirectly contact with the metal oxide semiconductor layer CH, respectively. In another embodiment, there may further be at least one intermediate layer between the first layers 105a and 105b and the metal oxide semiconductor layer CH, and the first layers 105a and 105b are indirectly contact with the metal oxide semiconductor layer CH. In another embodiment, there may be at least one insulating layer between the first layer 105a, the second layer 106a, and the third layer 107a, and the first layer 105a, the second layer 106a, and the third layer 107a are indirectly contact. Also, there may be at least one insulating layer between the first layer 105b, the second layer 106b, and the third layer 107b, and the first layer 105b, the second layer 106b, and the third layer 107b are indirectly contact.

In the present embodiment, the first layer 105a and the first layer 105b belong to the same film layer, the second layer 106a and the second layer 106b belong to the same film layer, and the third layer 107a and the third layer 107b belong to the same film layer. That is, the first layer 105a and the first layer 105b are made of the same material, the second layer 106a and the second layer 106b are made of the same material, and the third layer 107 and the third layer 107b are made of the same material. In the present embodiment, the material of the first layer 105a and the first layer 105b includes titanium nitride. In detail, in the present embodiment, the titanium nitride used for the first layer 105a and the first layer 105b is TiNx, where x is greater than or equal to 0.05 and less than or equal to 1.5 (0.05≤x≤1.5), and preferably x is greater than or equal to 0.1 and less than or equal to 1.2 (0.1≤x≤1.2). In the present embodiment, the material of the second layer 106a and the second layer 106b includes, but are not limited to, aluminum, copper, or silver. In the present embodiment, the material of the third layer 107 and the third layer 107b includes, but are not limited to, a single layer or a stack of one of molybdenum nitride, molybdenum, titanium and magnesium, or a stack or a mixture of the at least two above-mentioned materials. Additionally, in the present embodiment, the source S and the corresponding data line DL are continuous conductive pattern, and this means that the source S is electrically connected to the corresponding data line DL. From another point of view, in the present embodiment, the data lines DL include the same stack as the sources S, that is, the data line DL also includes the first layer 105a, the second layer 106a, and the third layer 107a. In another embodiment, the sources S and the data lines DL may include different stacks, and may be formed in different processes, but the present disclosure is not limited thereto. In another embodiment, the drain D rather than the source S may be electrically connected to the corresponding data line DL.

In an embodiment, the method of forming the sources S, the drains D, and the data lines DL includes the following steps, but the present disclosure is not limited thereto. First, a first film formation material layer, a second film formation material layer, and a third film formation material layer are sequentially formed on the substrate 102, wherein the material of the first film forming material layer is titanium nitride, the material of the second film forming material layer is aluminum, the material of the third film forming material layer is molybdenum nitride, and the forming method is a physical vapor deposition method or a chemical vapor deposition method. Next, after the first film formation material layer, the second film formation material layer, and the third film formation material layer are subjected to a photolithography process, the third film formation material layer and the second film formation material layer are etched by a wet etching process, and the first film-forming material layer is etched by a dry etching process. The etching solution used in the wet etching process is, for example, one of phosphoric acid ($H_3PO_4$), nitric acid ($HNO_3$) and acetic acid ($CH_3COOH$), or a mixture of the at least two above-mentioned materials in various proportions. The dry etching gas used in the dry etching process is, for example, one of chlorine gas ($O_2$), carbon tetrafluoride ($CF_4$), oxygen ($O_2$), boron trichloride ($BCl_3$) and sulfur hexafluoride ($SF_6$), or a mixture of the at least two above-mentioned materials.

Additionally, in the present embodiment, a cross-sectional view of the first layer 105a, the second layer 106a and the third layer 107a, and the cross-sectional view of the first layer 105b, the second layer 106b and the third layer 107b may form a stair shape. In detail, in the present embodiment, a distance Y is between the edge of the first layer 105a and the edge of the second layer 106a and between the edge of the first layer 105b and the edge of the second layer 106b, and the distance Y is, for example, greater than or equal to 0.1 μm and less than or equal to 0.3 μm (0.1 μm≤$_Y$≤0.3 μm).

Additionally, in the present embodiment, the thickness of the first layer 105a and the first layer 105b is, for example, greater than or equal to 100 Å and less than or equal to 700 Å. The thickness of the second layer 106a and the second layer 106b is, for example, greater than or equal to 1000 Å and less than or equal to 2000 Å, and the thickness of the third layer 107a and the third layer 107b is, for example, greater than or equal to 100 Å and less than or equal to 700 Å.

It is worth noting that, in the present embodiment, the material of the first layer 105a and the first layer 105b includes titanium nitride, during the manufacturing process of the active elements T, the titanium atoms in the first film forming material layer are hard to diffuse into the metal oxide semiconductor layer CH, thereby reducing the oxygen deficiency caused by the bonding of oxygen atoms and titanium atoms in the surface of the metal oxide semiconductor layer CH. When the oxygen deficiency occurs in the portion of the metal oxide semiconductor layer without overlapped by the source and the drain, the electrical characteristic of the active element is easily to change, thereby reducing the reliability of the display device. Accordingly, because the material of the first layer 105a and the first layer 105b includes titanium nitride, the display device 10 may have better reliability than the conventional display device in which the material of the film layer in direct contact with the metal oxide semiconductor layer of the source and the drain is titanium.

Hereinafter, more specifically describe the features of the present disclosure, the metal oxide semiconductor thin film transistors of Example 1 and Comparative Example 1 will be described, and the surface of the metal oxide semiconductor layer in metal oxide semiconductor thin film transistor will be subjected to secondary ion mass spectroscopy (SIMS) analysis. Although the following Example 1 is described, materials used, processing details and the like can be appropriately changed without departing from the scope of the present disclosure. Accordingly, the present disclosure should not be construed in a limited manner by the following examples.

In the metal oxide semiconductor thin film transistor of Example 1, the gate is formed of a layer comprising molybdenum disposed on a layer comprising neodymium-aluminum alloy (AlNd/Mo) from the bottom to top, the gate insulating layer is formed of a layer comprising silicon oxide disposed on a layer comprising silicon nitride ($SiN_x/SiO_x$) layer from the bottom to top, the material of the metal oxide semiconductor layer is IGZO, the material of the first layers of the source and the drain is titanium nitride, the material of the second layers of the source and drain is aluminum, and the material of the source and the drain of the third layer is molybdenum nitride.

In the metal oxide semiconductor thin film transistor of Comparative Example 1, the gate is forming of a layer comprising molybdenum disposed on a layer comprising neodymium-aluminum alloy (AlNd/Mo) from the bottom to top, the gate insulating layer is formed of a layer comprising silicon oxide disposed on a layer comprising silicon nitride ($SiN_x/SiO_x$) layer from the bottom to top, the material of the metal oxide semiconductor layer is IGZO, the material of the first layers of the source and the drain is titanium, the material of the second layers of the source and drain is aluminum, the material of the source and the drain of the third layer is molybdenum nitride.

In the process of fabricating the metal oxide semiconductor thin film transistor using the source and the drain as a mask before and after the metal oxide semiconductor layer was etched in Example 1 or Comparative Example 1, a titanium atom concentration analysis on the surface of the metal oxide semiconductor layer exposed by the source and drain was performed using a secondary ion mass spectrometer by the EAG (Evans Analytical Group), wherein the etch depth is about 240 Å. The results of the above analysis are shown in Table 1.

TABLE 1

| | Example 1 | | Comparative Example 1 | |
|---|---|---|---|---|
| | Etch Depth (Å) | | | |
| | 0 | 240 | 0 | 240 |
| Titanium atom concentration (atoms/cc) | $1.24 \times 10^{21}$ | $3.35 \times 10^{19}$ | $2.15 \times 10^{21}$ | $1.61 \times 10^{21}$ |
| Titanium atomic concentration ratio after and before etching (%) | | 2.7 | | 74.88 |

As shown in Table 1, comparing the titanium atom concentration of the metal oxide semiconductor thin film transistor between the first layer made of titanium in Example 1 and the first layer made of titanium nitride in Comparative Example 1 at an Etch Depth 240 Å. The analyzed titanium atom concentration was obviously reduced to $3.35 \times 10^{19}$ atoms/cc in Example 1.

The results confirmed that by using titanium nitride as the material of the first layer of the source and the drain, titanium atoms are not easy to diffuse into the metal oxide semiconductor layer during the manufacture process. Further, compared with the metal oxide semiconductor thin film transistor of Comparative Example 1 in which the material of the first layer is titanium, in the metal oxide semiconductor thin film transistor of Example 1 in which the material of the first layer is titanium, it is possible to effectively reduce the electrical variations caused by the oxygen deficiency by etching the metal oxide semiconductor layer to a shorter depth.

Additionally, in the present embodiment, because the material of the first layer 105a and the first layer 105b includes titanium nitride, the first layer 105a and the first layer 105b may be a barrier layer to reduce a number of the metal atoms in the second layer 106a and the second layer 106b diffusing into the metal oxide semiconductor layer CH to affect the electrical performance of the active elements T.

The insulating layer PV overlaps the active elements T to protect the active elements T. The material of the insulating layer PV may be, but not limited to, an inorganic material, an organic material or a combination thereof. For example, the inorganic material may be, but not limited to, silicon oxide, silicon nitride, silicon oxynitride, aluminum oxide; and the organic material may be, but not limited to, a single layer or a stack of one of polymer materials such as a polyimide-based resin, an epoxy-based resin, an acrylic-based resin, or a stack or a mixture of at least two of the polymer materials. In another embodiment, there may be at least one insulating layer between the insulating layer PV and the active elements T, and the insulating layer PV is not in direct contact with the active elements T. In an embodiment, the insulating layer PV may be deposited comprehensively on the substrate 102 by a physical vapor deposition or a chemical vapor deposition, for example. Additionally, the insulating layer PV is not shown in FIG. 2.

A plurality of pixel electrodes PE is disposed to correspond to the plurality of active elements T, and a plurality of pixel electrodes PE are disposed on the insulating layer PV. In detail, in the present embodiment, one pixel electrode PE is electrically connected to one of the active elements T. Additionally, in the present embodiment, the pixel electrode PE is electrically connected to the corresponding drain D through the contact window opening H. The contact window opening H is disposed in the insulating layer PV to expose a portion of the drain D. In another embodiment, the contact window opening H may also expose a portion of the source S rather than the drain D. In another embodiment, there may be at least one insulating layer between the plurality of pixel electrodes PE and the insulating layer PV, and the plurality of pixel electrodes PE are not in direct contact with the insulating layer PV.

The pixel electrodes PE may be transmissive pixel electrodes, reflective pixel electrodes, or transflective electrodes. The material of the transmissive pixel electrode includes metal oxides, but not limited to, a single layer or a stack of one of indium tin oxide (ITO), indium zinc oxide (IZO), aluminum tin oxide (ATO), aluminum zinc oxide and the like, or a stack or a mixture of the at least two above-mentioned materials. The material of the reflective pixel electrode includes conductive materials having a high reflectivity, but not limited to, a single layer or a stack of one of silver (Ag), aluminum (Al) and the like, or a stack or a mixture of the at least two above-mentioned materials.

In the present embodiment, the opposing substrate 110 is disposed opposite to the element substrate 100. In the present embodiment, the opposing substrate 110 includes a substrate 112, a light shielding pattern layer BM disposed on the substrate 112, a plurality of color filter patterns CF, and an opposing electrode layer 114. In another embodiment, the light blocking pattern layer BM, the plurality of color filter patterns CF, and the opposing electrode layer 114 may be optionally disposed on the substrate 102. In another embodiment, the light-blocking pattern layer BM, the plurality of color filter patterns CF, and/or the opposing electrode layer 114 may be selected not to be disposed, depending on the display mode. In another embodiment, there may be at least one insulating layer between the substrate 112 and the light-blocking pattern layer BM, the substrate 112 and the plurality of color filter patterns CF, and the substrate 112 and the opposing electrode layer 114, which means the substrate 112 and the light-blocking pattern layer BM are indirectly contact with each other, the substrate 112 and the plurality of color filter patterns CF are indirectly contact, and the substrate 112 and the opposing electrode layer 114 are indirectly contact.

The light-shielding pattern layer BM is used to shield the members of the display device 10 that are not to be seen, such as the scan lines SL, the data lines DL, the active elements T or other lines not shown. More specifically, in the present embodiment, the light blocking pattern layer BM is spatially overlapped with the scan lines SL and the data lines DL. However, it will be understood by anyone of ordinary skill in the art that the light shielding pattern layer BM may completely overlap or partially overlap with the scan lines SL and the data lines DL. In addition, the light blocking pattern layer BM has a plurality of openings Z arranged in an array, and the openings Z are disposed to correspond to the active elements T and the pixel electrodes PE. The material of the light-blocking pattern layer BM may include, for example, a single layer or a stack of black resin or other suitable low-reflection insulating material, or a stack or a mixture of the at least two above-mentioned materials. However, the present disclosure is not limited thereto. In another embodiment, the material of the light-blocking pattern layer BM may be a light-blocking metal or other suitable low-reflection material, and if the material of the light-shielding pattern layer BM is the light-shielding metal, an insulating layer may be disposed between the light-blocking pattern layer BM and the opposing electrode layer 114. In another embodiment, in an inorganic light emitting diode display or an organic light emitting diode display, the light shielding pattern layer BM may optionally be disposed.

The plurality of color filter patterns CF is disposed to correspond to the plurality of openings Z of the light-shielding pattern layer BM. The color filter patterns CF include, for example, red filter patterns, green filter patterns and blue filter patterns, but the present disclosure is not limited thereto. Additionally, the color filter patterns CF may include transparent filter patterns made of a transparent photoresist. In another embodiment, in an inorganic light emitting diode display or an organic light emitting diode display, the color filter patterns CF may optionally be disposed.

The opposing electrode layer 114 is disposed on the light blocking pattern layer BM and the color filter patterns CF. The material of the opposing electrode layer 114 may be, for example but not limited to, a single layer or a stack of one of indium tin oxide (ITO), indium zinc oxide (IZO), aluminum tin oxide (ATO), aluminum zinc oxide and the like, or a stack or a mixture of the at least two above-mentioned materials. Additionally, the opposite electrode layer 114 is not shown in FIG. 2.

The display layer 120 is disposed between the element substrate 100 and the opposing substrate 110. In the present embodiment, the display layer 120 includes liquid crystal molecules. The liquid crystal molecules may be any of liquid crystal molecules known by those of ordinary skill in the art.

In particular, although the above-described embodiments have been described taking the display device 10 as a liquid crystal display device as an example, the present disclosure is not limited thereto. In another embodiment, the display device of the present disclosure may be an inorganic light emitting diode display device, an organic light emitting diode display device, or the like. In an embodiment in which the display device is an inorganic light emitting diode display device, the element substrate may include, in addition to the substrate 102 and the active elements T described in the foregoing embodiments, other members required for different design requirements; the display layer is an inorganic light emitting diode material or element unit; and the opposing substrate may be any of the opposing substrates known by those of ordinary skill in the art. In an embodiment in which the display device is an organic light emitting diode display device, the element substrate may include, in addition to the substrate 102 and the active elements T described in the foregoing embodiments, other members required for different design requirements; the display layer is an organic light emitting diode material or element unit, the opposing substrate may be any of the opposing substrates known by those of ordinary skill in the art. As described above, because the material of each of the first layer 105a of the source S and the first layer 105b of the drain D include titanium nitride, the titanium atoms are not easy to diffuse into the metal oxide semiconductor layer CH during the manufacture of the active elements T, and therefore the oxygen deficiency which changes the electrical performance of the active elements T may be reduced. The display device 10, other types of display devices of the present disclosure also have good reliability by including the active elements T.

Figure 4:
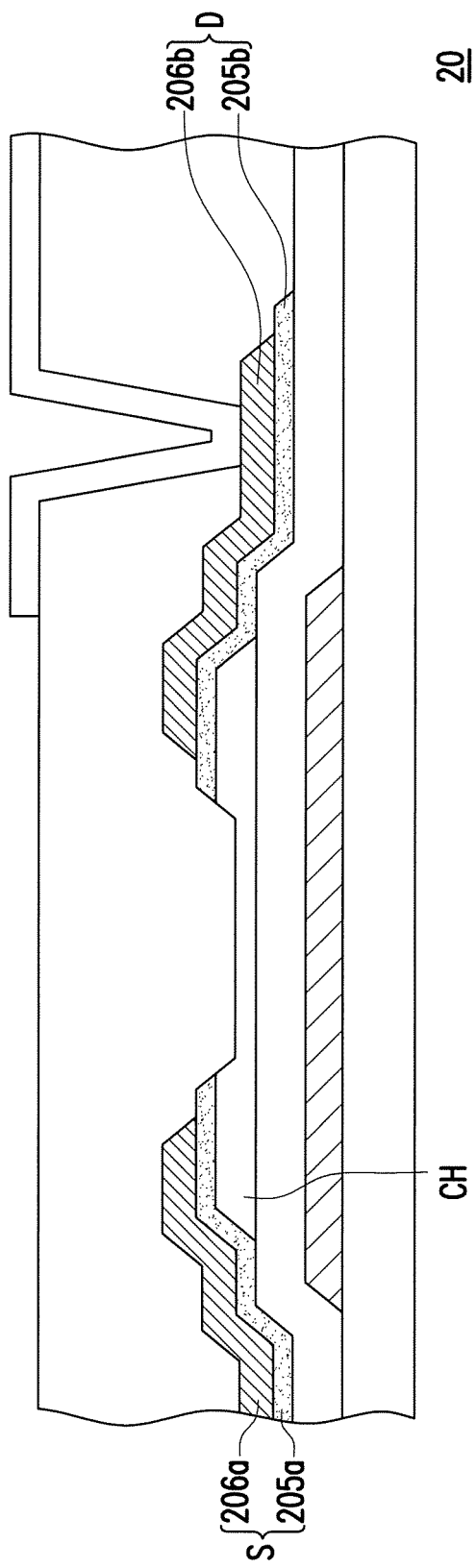
FIG. 4 is a partial cross-sectional view of an element substrate according to another embodiment of the present disclosure.

In addition, although the foregoing embodiment provides the display device 10, the present disclosure is not limited thereto. In another embodiment of the present disclosure, an element substrate 20 is provided, as shown in FIG. 4.

Additionally, in the element substrate 100 of the foregoing embodiment, the source S includes the first layer 105a, the second layer 106a, and the third layer 107a, and the drain D includes the first layer 105b, the second layer 106b, and the third layer 107b, i.e., the source S and the drain D have a three-layer structure, but the present disclosure is not limited thereto. In the element substrate 20 of FIG. 4, the source S includes a first layer 205a and a second layer 206a, and the drain D includes a first layer 205b and a second layer 206b. That is, the source S and the drain D in the element substrate 20 have a two-layer structure. In details, the embodiment shown in FIG. 4, the first layer 205a of the source S is deposed between the metal oxide semiconductor layer CH and the second layer 206a, and the first layer 205b of the drain D is deposed between the metal oxide semiconductor Layer CH and the second layer 206b.

As described above, in the display device and the element substrate of the present disclosure, the active element in the element substrate includes a gate, a gate insulating layer, a metal oxide semiconductor layer, a source, and a drain, wherein the source and the drain respectively include a first layer and a second layer sequentially stacked from the metal oxide semiconductor layer, and the material of the first layer includes titanium nitride, and therefore the titanium atoms are not easy to diffuse into the metal oxide semiconductor layer during the manufacture of the active element. As a result, the oxygen deficiency which easily changes the electrical performance of the active element may be reduced on the surface of the metal oxide semiconductor layer, and thus the device substrate and the display device have good reliability.

Finally, it should be noted that the above embodiments are merely illustrative of the technical solutions of the present disclosure and are not intended to be limiting. While the present disclosure has been described in detail with reference to the foregoing embodiments, it will be understood by those skilled in the art that modifications may be made to the technical solutions described in the foregoing embodiments or equivalents may be substituted for some or all of the technical features therein, and modifications and substitutions do not depart from the spirit and scope of the technical solutions of the embodiments of the present disclosure.

What is claimed is:

1. An element substrate, comprising
a substrate; and
an element layer disposed on the substrate, wherein the element layer includes a plurality of active elements, the plurality of active elements respectively comprises:
a gate disposed on the substrate;
a gate insulating layer disposed on the substrate and overlapping the gate;
a metal oxide semiconductor layer disposed on the gate insulating layer; and
a source and a drain disposed on the metal oxide semiconductor layer,
wherein the metal oxide semiconductor layer has a first portion and a second portion, the source and the drain overlap the first portion, the source and the drain do not overlap the second portion, the first portion has a first thickness, the second portion has a second thickness, and the first thickness is greater than the second thickness,
wherein a difference between the first thickness and the second thickness is greater than or equal to 200 Å and less than or equal to 600 Å, and
wherein the source and the drain respectively comprise a first layer and a second layer, the first layer is disposed between the second layer and the metal oxide semiconductor layer, a material of the first layer comprises titanium nitride, a distance is between an edge of the first layer and an edge of the second layer, and the distance is greater than or equal to 0.1 μm and less than or equal to 0.3 μm.

2. The element substrate as claimed in claim 1, wherein the titanium nitride is TiNx, and x is greater than or equal to 0.05 and less than or equal to 1.5.

3. The element substrate as claimed in claim 1, wherein the source and the drain respectively further comprise a third layer, the second layer is disposed between the first layer and the third layer, a material of the second layer comprises at least one of aluminum and copper, a material of the third layer comprises at least one of molybdenum nitride, molybdenum and titanium.

4. A display device, comprising:
an element substrate comprising a substrate and an element layer, wherein the element layer is disposed on the substrate, the element layer comprises a plurality of active elements, the plurality of active elements respectively comprises:
a gate disposed on the substrate;
a gate insulating layer disposed on the substrate and overlapping the gate;
a metal oxide semiconductor layer disposed on the gate insulating layer;

a source and a drain disposed on the metal oxide semiconductor layer, wherein the metal oxide semiconductor layer has a first portion and a second portion, the source and the drain overlap the first portion, the source and the drain do not overlap the second portion, the first portion has a first thickness, the second portion has a second thickness, the first thickness is greater than the second thickness, wherein a difference between the first thickness and the second thickness is greater than or equal to 200 Å and less than or equal to 600 Å, and wherein the source and the drain respectively comprise a first layer and a second layer, the first layer is disposed between the second layer and the metal oxide semiconductor layer, a material of the first layer comprises titanium nitride, a distance is between an edge of the first layer and an edge of the second layer, and the distance is greater than or equal to 0.1 μm and less than or equal to 0.3 μm;

an opposing substrate disposed relative to the element substrate; and a display layer disposed between the element substrate and the opposing substrate.

5. The display device as claimed in claim 4, wherein the titanium nitride is TiNx, and x is greater than or equal to 0.05 and less than or equal to 1.5.

6. The display device as claimed in claim 4, wherein the source and the drain of the element substrate respectively further comprise a third layer, the second layer is disposed between the first layer and the third layer, a material of the second layer comprises at least one of aluminum and copper, a material of the third layer comprises at least one of molybdenum nitride, molybdenum and titanium.

* * * * *